United States Patent [19]
Park et al.

[11] Patent Number: 4,937,471
[45] Date of Patent: Jun. 26, 1990

[54] BIDIRECTIONAL INPUT-OUTPUT CELL

[75] Inventors: Haksong Park; Kwanyong Sung; Heonjoon Kim; Chaimin Lee, all of Seoul, Rep. of Korea

[73] Assignee: Samsung Electronics Co., Ltd., Suwon, Rep. of Korea

[21] Appl. No.: 277,201

[22] Filed: Nov. 29, 1988

[30] Foreign Application Priority Data

Nov. 30, 1987 [KR] Rep. of Korea ............ 87-13615

[51] Int. Cl.$^5$ ............ H02N 3/22; H01L 27/04; H01L 29/78; H03K 17/08
[52] U.S. Cl. .................. 307/296.5; 357/23.13; 357/23.8; 361/56; 361/58; 361/91
[58] Field of Search ............ 361/58, 91, 111, 56; 357/41, 68, 23.8, 23.13; 307/296 R, 297, 585, 469, 451, 448, 571, 465, 296.5, 296.1, 482.1

[56] References Cited

U.S. PATENT DOCUMENTS

| | | | |
|---|---|---|---|
| 3,947,727 | 3/1976 | Stewart | 361/91 |
| 4,649,289 | 3/1987 | Nakano | 307/571 |
| 4,777,518 | 10/1988 | Mihara et al. | 357/41 |
| 4,802,054 | 1/1989 | Yu et al. | 361/91 |
| 4,808,844 | 2/1989 | Ozaki et al. | 307/585 |
| 4,811,155 | 3/1989 | Kuriyama et al. | 361/58 |
| 4,829,350 | 5/1989 | Miller | 357/23.13 |
| 4,839,768 | 6/1989 | Daniel et al. | 357/23.13 X |
| 4,868,705 | 9/1989 | Shiochi et al. | 357/23.13 X |
| 4,870,530 | 9/1989 | Hurst et al. | 357/23.13 X |

Primary Examiner—Stanley D. Miller
Assistant Examiner—David R. Bertelson
Attorney, Agent, or Firm—Cushman, Darby & Cushman

[57] ABSTRACT

A bidirectional input-output cell characterized in a logic means has MOS transistors of which semiconductor region approaches through whole side of outer drain region in the opposite position of channel and is the opposite type conductivity of said drain region conductivity. The bidirectional input-output cell can prevent the breakdown of semiconductor device come out the surge current of electrostatic discharge voltage in said semiconductor region.

6 Claims, 3 Drawing Sheets

BIDIRECTIONAL INPUT-OUTPUT CELL

The present invention relates to a semiconductor device, particularly to a bidirectional input-output cell for input protection and prevention of latch-up.

Figure 1:
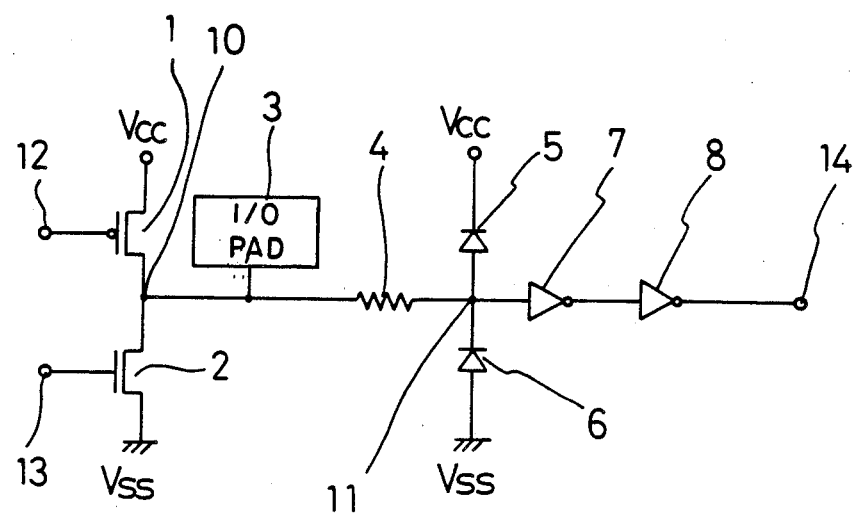
FIG. 1 illustrates a bidirectional input-output cell used as an input or output terminal in a prior art CMOS circuit.

A bidirectional input-output cell used as input or output terminal in the prior C MOS integrated circuit is shown as FIG. 1.

FIG. 1 is a circuit diagram of bidirectional input-output cell.

Referring to the drawing, it consists of a P MOS transistor(1) and a N MOS transistor(2) which channels are serially connected between power supply voltage Vcc and ground voltage Vss, the first terminal(12) connected to the gate of said P MOS transistor(1), the second terminal(13) connected to the gate of said N MOS transistor(2), the first node(10) connected to said drain of the P MOS transistor(1) and N MOS transistor(2), diodes(5)(6) connected serially between power supply voltage Vcc and ground voltage Vss, the second node(11) between said diodes, the resistor(4) of poly crystalline silicon connected between the first node and the second node, the input-output pad(3) connected to said first node(10), the third terminal(14), and even inversion gates(7)(8) connected between said second node(11) and said third terminal(14).

In an input-output cell of the structure as above-mentioned input, is transmitted to inside of chip through the input-output pad(3), the poly silicon crystalline resistor(4), the second node(11), inversion gates(7), (8) and the third terminal(14) in order. Also, output is transmitted to input-output pad by a control logic in the chip supplied to the first terminal and the second terminal.

Figure 2:
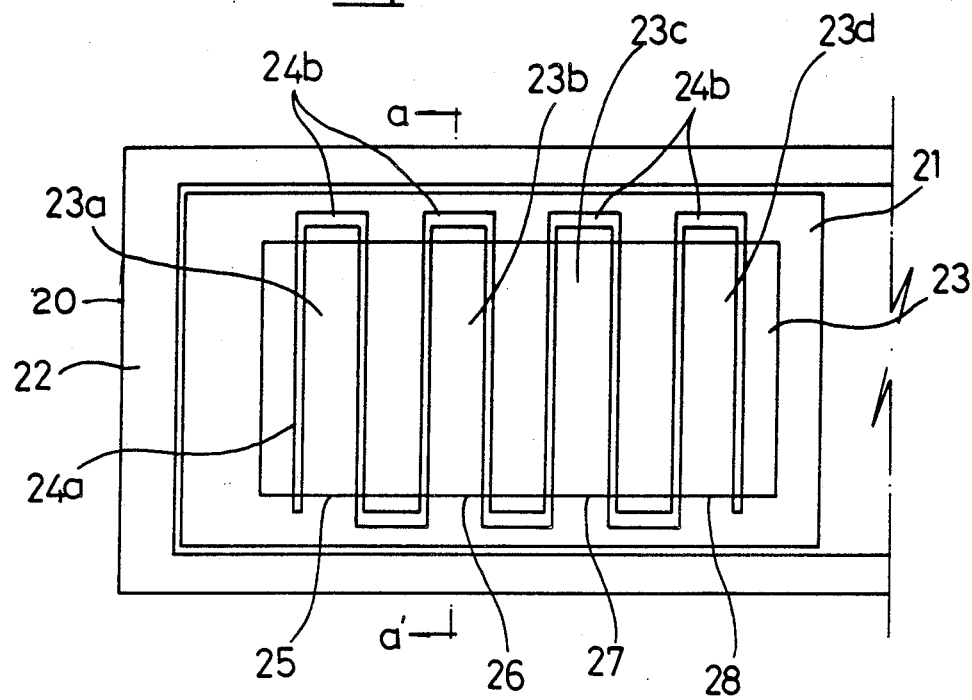
FIG. 2 illustrates a layout plan view of an NMOS transistor of FIG. 1.

FIG. 2 is a layout plan view of N MOS transistor(2) of FIG. 1.

Referring to the drawing, the region(20) is N type substrate(or well) region, the region(21) is P-well, the region(22) is P+ guard ring surrounding p-well(21) at substrate surface, the region(23) is N+ region which becomes drain and source of the N MOS transistor, the region(24a) is a poly crystalline silicon gate, the region(24b) is a poly crystalline silicon gate connected to the second terminal(13) of FIG. 1, and regions(23a)-(23d) are N+drain region of the N MOS transistor connected to the first node(10) of FIG. 1.

Figure 3:
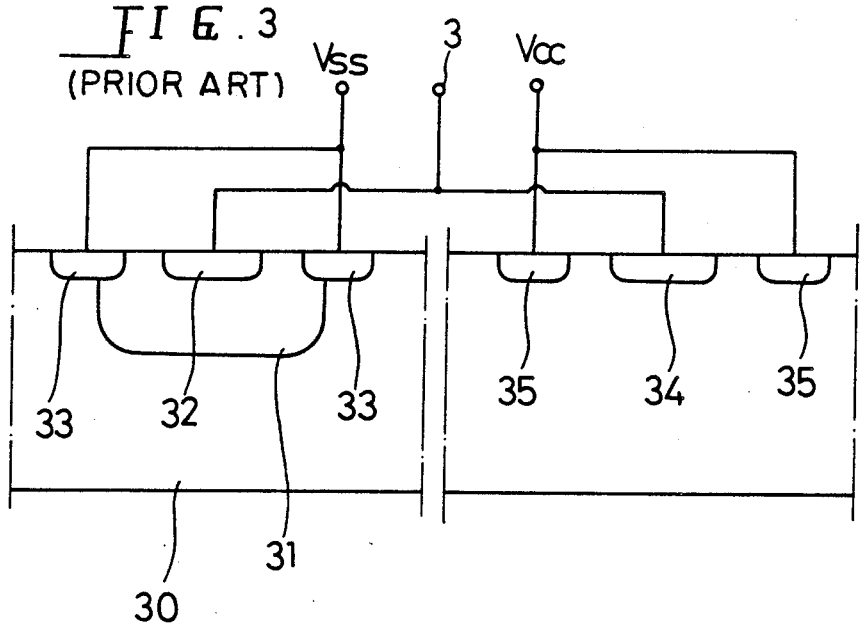
FIG. 3 illustrates only the connection relation with the substrate of section cutting a—a' of FIG. 2 to the whole plan view of FIG. 1.

FIG. 3 illustrates only the connection relation with the substrate of section cutting by a—a' of FIG. 2 to the whole plan view of FIG. 1. and each terminal.

Referring to the drawing, the drain(32) of N MOS transistor is formed in the P-well(31) formed on the semiconductor substrate(30), the P+ guard ring(33) is formed around said P-well(31), the drain(35) of P MOS transistor at the designated region on the N type substrate(30), the N+ guard ring(33) at the circumference of P MOS transistor, ground voltage Vss is applied to the P+ guard ring(33), power supply voltage Vcc to the N+ guard ring(35), and the drain of each transistor is connected to the input-output pad.

High voltage occurs suddenly by means of electrostatic discharge voltage in the input-output pad(3) of said input-output cell, so that excessive current occurs.

If negative high voltage is inputted to the input-output pad(3), negative high voltage is applied to regions(23a)-(23d) of FIG. 2 and the region(32) of FIG. 3 through the first node(10) of FIG. 1.

Then current flows to the P+ guard ring(22) through regions(25)-(28) which the drain and the substrate of FIG. 2 are in contact with. But, said narrow regions(25)-(28) cannot remove excessive current occurred by the applied voltage to the input-output pad(3) at early time, and then excessive current flow. Therefore, there was a problem that an element is broken down by a thermal phenomena due to partial high temperature when said excessive current is inputted inside the chip.

Thus the object of the present invention is to provide a semiconductor device which can prevent the breakdown of semiconductor device and latch-up if unexpected high voltage or electrostatic discharge voltage etc. is applied.

Figure 4:
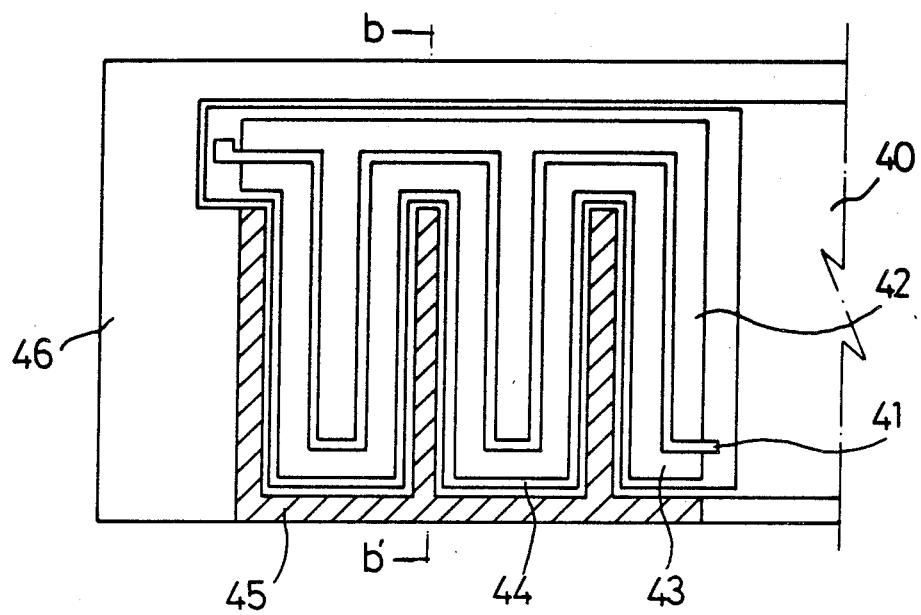
FIG. 4 illustrates a partial layout plan view of FIG. 1 according to the present invention.

The object as well as advantages of the present invention will become clear by the following description of a preferred embodiment of the present invention with reference to the accompanying drawings, wherein:

FIG. 4 is a partial layout plan view of FIG. 1 according to the present invention.

Figure 5:
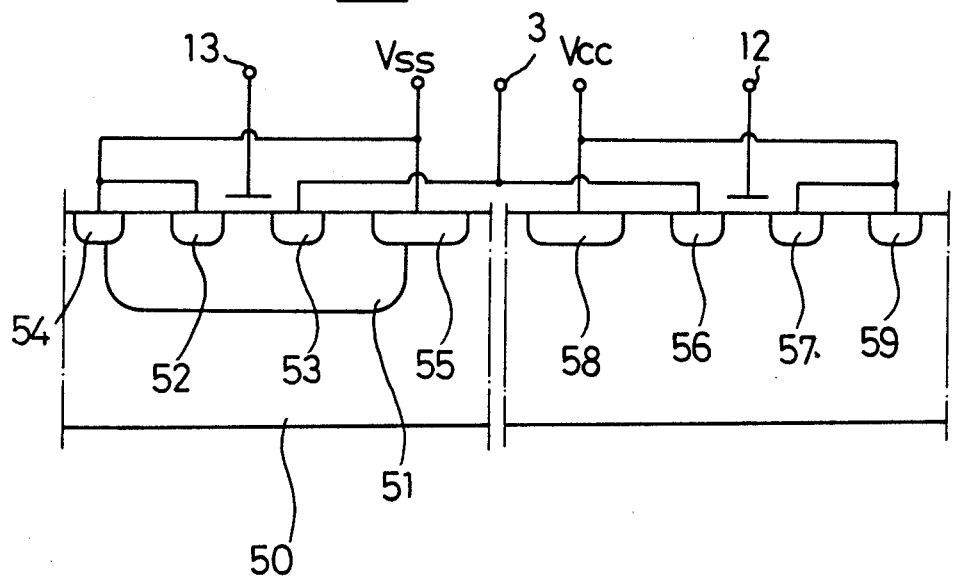
FIG. 5 illustrates a sectional view taken at b—b' in FIG. 4 to the whole layout plan view of FIG. 1 according to the present invention.

FIG. 5 is a sectional view taken at b—b' in FIG. 4 to the whole layout plan view of FIG. 1 according to the present invention.

The present invention consists of composition elements as such those of FIG. 1.

FIG. 4 is a layout plan view of the N MOS transistor(2) of FIG. 1 of the present invention.

As shown in FIG. 4, the rigion(40) is N type semiconductor substrate(or well), the region(41) is poly crystalline silicon gate, the region(42) is source of N MOS transistor, the region(43) is drain of N MOS transistor, the region(44) is P type well, the region(45) is P+ guard ring combining P+ sink, and the region(46) is P+ guard ring.

Ground voltage is supplied to the said region(42) through undrawn contact regions, and the voltage applied to input-output pad is supplied to region(43) through undrawn contact.

Though it is not illustrated in the drawing, it should be noticed that N+ guard ring(or N+ sink) of P MOS transistor such as P+ guard ring of N MOS transistor is formed near drain region.

FIG. 5 illustrates only the connection relation with substrate of section cutting by b—b' of FIG. 4 to the whole layout plan view of the present invention and each terminal.

Referring to the drawing, the region(51) formed on N-type semiconductor substrate(or well) is P well, the region(52) is source of N MOS transistor which ground voltage Vss is applied to, the region(53) is drain of N MOS transistor connected to input-output pad(3), regions(54) and (55) are P+ guard ring that ground voltage is applied to, the region(56) is drain of P MOS transistor connected to input-output pad(3), region(57) is source connected to power supply voltage Vcc, and regions(58)(59) are N+ guard ring that power supply voltage is applied to.

If negative high voltage is inputted to the input-output pad(3), negative high voltage is applied to the region(43) of FIG. 4 through the first node of FIG. 1.

As shown in the drawing of FIG. 4, wide P+ guard ring(45) is formed near front side of the drain region(43), so surge current that come about drain region is dispersed through P+ sink(45).

Also, if positive voltage is applied, it flows surge current to N+ sink through drain(56) of P MOS transistor formed as shown in FIG. 5.

Consequently it not only prevents C MOS element from destroying by removing Surge current due to electrostatic discharge voltage, etc. with the P+ sink(45) or N+ sink and protection diodes(5)(6) at the same time, but reduces the absolute quantity of minority carrier going to drain region of the other transistor by preventing minority carrier injected to substrate from diffusing to a long distance because P+, N+ sink is not different from layout guard ring at wide area.

As above-mentioned, there is an advantage to prevent latch-up effectively by preventing diffusion of minority carrier and to promote the reliability of C MOS integrated circuit.

What is claimed is:

1. A bidirectional input-output cell having a power supply terminal and a ground supply terminal, comprising:
    an input-output pad connected between a first node and a second node;
    a PMOS transistor including a p-type substrate, a source, a drain, a gate, a first n+ guard ring disposed along the surface of the substrate and near the source, and a second n+ guard ring including an n+ sink disposed along the surface of the substrate and near the drain, wherein the guard rings and the source connect to the power supply terminal and the drain connects to the first node;
    an NMOS transistor including an n-type substrate, a source, a drain, a gate, a first p+ guard ring disposed along the surface of the substrate and near the source, a second p+ guard ring including a p+ sink disposed along the surface of the substrate and near the drain, and a p-type well disposed beneath and adjacent to the guard rings, the source and the drain, wherein the guard rings and the source connect to the ground terminal and the drain connects to the first node;
    a first terminal and a second terminal for inputting a designated signal, said first and second terminals connected to the gates of the PMOS and NMOS transistors, respectively;
    an input protection means connected to the second node, the power supply terminal and the ground terminal;
    a third terminal for inputting the designated signal; and
    a buffer means connected between the second node and the third terminal.

2. A bidirectional input-output cell as recited in claim 1, wherein said input protection means includes a pair of diodes.

3. A bidirectional input-output cell as recited in claim 1, wherein said buffer means ncludes a pair of inversion gates.

4. A bidirectional input-output cell as recited in claim 1, further comprising a resistor connected between the first node and the second node.

5. A semiconductor device for preventing breakdown and latch-up of circuit elements contained therein comprising:
    a power supply terminal;
    a ground terminal;
    an input-output pad;
    a PMOS transistor including a p-type substrate, a source disposed on the surface of the substrate and connected to the power supply terminal, a drain disposed on the surface of the substrate and connected to the input-output pad, a gate, a first n+ guard ring disposed along the surface of the substrate and near the source, and a second n+ guard ring including an n+ sink disposed along the surface of the substrate and near the drain, said guard rings connected to the power supply terminal; and
    an NMOS transistor including an n-type substrate, a source disposed on the surface of the substrate and connected to the ground terminal, a drain disposed on the surface of the substrate and connected to he input-output pad, a gate, a first p+ guard ring disposed along the surface of the substrate and near the source, a second p+ guard ring including a p+ sink disposed along the surface of the substrate and near the drain, said guard rings connected to the ground terminal, and a p-type well disposed beneath and adjacent to the guard rings, the source and the drain.

6. A semiconductor device for preventing breakdown and latch-up of circuit elements contained therein, comprising:
    a power supply terminal;
    a ground terminal;
    an input-output pad;
    a first MOS transistor including a substrate of a first conductivity, a source disposed on the surface of the substrate and connected to the power supply terminal, a drain disposed on the surface of the substrate and connected to the input-output pad, a gate, a heavily doped first guard ring of a second conductivity disposed along the surface of the substrate and near the source, and a heavily doped second guard ring of the second conductivity including a heavily doped sink of the second conductivity disposed along the surface of the substrate and near the drain, said guard rings connected to the power supply terminal; and
    a second MOS transistor including a substrate of the second conductivity, a source disposed on the surface of the substrate and connected to the ground terminal, a drain disposed on the surface of the substrate and connected to the input-output pad, a gate, a heavily doped first guard ring of the first conductivity disposed along the surface of the substrate and near the source, a heavily doped second guard ring of the first conductivity including a heavily doped sink of the first conductivity disposed along the surface of the substrate and near the drain, said guard rings connected to the ground terminal, and a well of the second conductivity disposed beneath and adjacent to the guard rings, the source and the drain,
    wherein the first conductivity is the opposite of the second conductivity.

* * * * *